United States Patent [19]

Serizawa

[11] Patent Number: 5,801,436
[45] Date of Patent: Sep. 1, 1998

[54] LEAD FRAME FOR SEMICONDUCTOR DEVICE AND PROCESS FOR PRODUCING THE SAME

[76] Inventor: Seiichi Serizawa, 64-6, Higashi-Omiya 6 Chome, Omiya-Shi, Saitama-Ken, Japan

[21] Appl. No.: 967,056

[22] Filed: Nov. 10, 1997

Related U.S. Application Data

[63] Continuation of Ser. No. 717,064, Sep. 20, 1996, abandoned.

[30]  Foreign Application Priority Data

Dec. 20, 1995 [JP] Japan ............... 7-349077
May 15, 1996 [JP] Japan ............... 8-143488

[51] Int. Cl.$^6$ ............... H01L 23/48; H01L 23/52; H01L 29/40
[52] U.S. Cl. ............... 257/677; 257/736; 257/766; 257/666; 438/123
[58] Field of Search ............... 257/677, 736, 257/766; 438/123

[56]  References Cited

U.S. PATENT DOCUMENTS

| | | | |
|---|---|---|---|
| 3,803,708 | 4/1974 | Wada et al. | 29/620 |
| 3,818,118 | 6/1974 | Bennett et al. | 174/52.3 |
| 3,933,684 | 1/1976 | Petrow et al. | 502/101 |
| 4,410,867 | 10/1983 | Arcidiacono et al. | 333/172 |
| 4,529,667 | 7/1985 | Shiga et al. | 428/646 |
| 5,552,031 | 9/1996 | Moon | 205/247 |

*Primary Examiner*—Mahshid D. Saadat
*Assistant Examiner*—Allan R. Wilson
*Attorney, Agent, or Firm*—Koda & Androlia

[57] ABSTRACT

The present invention relates to a lead frame for the formation of a frame structure of an integrated circuit, more particularly, to a lead frame, having a structure possessing excellent bondability, solder wettability, and Ag paste adhesion. A lead frame for a semiconductor device comprises a lead frame material; a Pd plating or a Pd alloy plating, provided on the lead frame material; and a layer as an uppermost layer formed of a Pd oxide and gold or silver. A process for producing a lead frame for a semiconductor device comprises the steps of: plating a lead frame material with Pd or a Pd alloy; flasing the surface of the Pd or Pd alloy plating with gold (Au); and heat-treating the plated lead frame material in the air to provide a thin Pd oxide layer in only a Pd portion on the surface of a diffusion layer formed of Pd and Au.

2 Claims, 4 Drawing Sheets

LEAD FRAME FOR SEMICONDUCTOR DEVICE AND PROCESS FOR PRODUCING THE SAME

This application is a continuation of application Ser. No. 08/717,064, filed Sep. 20, 1996, now abandoned.

BACKGROUND OF THE INVENTION

The present invention relates to a lead frame for the formation of a frame structure of an integrated circuit. More particularly, the present invention relates to a lead frame having a structure possessing excellent bondability, solder wettability, and Ag paste adhesion.

In conventional lead frames, for an integrated circuit, comprising a conductive substrate constituted by a chip mount section, a wire bonding section, and an external lead section, the surface of the chip mount section and the wire bonding section are plated with Ag or Au, while the external lead section comprises a Sn or Sn alloy layer. For these lead frames, the use of a plating mask is necessary, resulting in complicated production process and increased production cost.

In a further conventional lead frame, the whole surface thereof has a Ni plating as an intermediate layer and a Pd plating as the outermost layer (Japanese Patent Publication No. 49382/1988). This lead frame is disadvantageous in that, upon heat treatment, Pd in the surface layer is oxidized, or Ni in the intermediate layer is diffused into the Pd plating as the outermost layer to form an oxide of Ni on the surface thereof, resulting in deteriorated wire bondability and solder wettability.

In a still further conventional lead frame, a Pd or Pd alloy plated coating is formed on the whole surface of a lead frame material, and the coating is plated with Ag or Au (Japanese Patent Laid-Open No. 115558/1992). This lead frame has problems including that, in the case of Au plating, the noble metal Au increases the cost, while in the case of Ag plating, sulfiding occurs resulting in deteriorated properties.

Further conventional lead frames include a lead frame, plated with a palladium-bismuth alloy, proposed by the present inventors (Japanese Patent Laid-Open No. 120394/1994). This lead frame has excellent bondability, solder wettability, Ag paste adhesion, and adhesion of molding resin. According to this technique, the outermost surface layer portion of the internal lead section, the wire bonding section, and the external lead section has a 0.01 to 10 μm-thick palladium-bismuth (Pd-Bi) alloy layer having a bismuth content of not more than 10%.

SUMMARY OF THE INVENTION

An object of the present invention is to provide a lead frame, for a semiconductor device, having excellent bondability, solder wettability, and Ag paste adhesion, and a process for producing the same.

According to one aspect of the present invention, there is provided a lead frame for a semiconductor device, comprising: a lead frame material; a Pd plating or a Pd alloy plating provided on the lead frame material; and a layer as an uppermost layer formed of a palladium oxide (Pd) and gold (Au) or a Pd oxide and silver (Ag).

According to another aspect of the present invention, there is provided a process for producing a lead frame for a semiconductor device, comprising the steps of: plating a lead frame material with Pd or a Pd alloy; flashing the surface of the Pd or Pd alloy plating with Au or Ag; and heat-treating the plated lead frame material in the air to provide a Pd-Au diffusion layer or a Pd-Ag diffusion layer and to permit a thin oxide layer to be formed in only the Pd portion in the surface of the diffusion layer.

According to a further aspect of the present invention, there is provided a process for producing a lead frame for a semiconductor device, comprising the steps of: plating a lead frame material with a Pd-Au alloy or a Pd-Ag alloy; and heat-treating the plated lead frame material in the air to provide a thin Pd oxide layer in only the Pd portion in the surface of the alloy layer.

The present invention offers advantages such as the provision of lead frames having better bondability, solder wettability, and Ag paste adhesion than the conventional lead frames and more efficient production process.

DETAILED DESCRIPTION OF THE INVENTION

Figure 1:
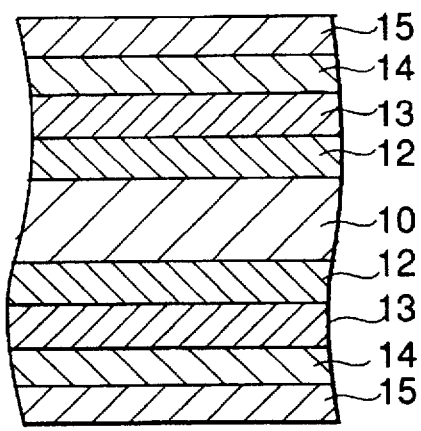
FIG. 1 is an enlarged, explanatory, sectional view of a part of a lead frame according to one embodiment of the present invention. Numeral 10 designates a copper alloy material, numeral 12 a Ni plating, numeral 13 a Pd plating, numeral 14 a Pd-Au diffusion layer, numeral 15 a palladium oxide-Au intermixture layer.

A lead frame is a frame structure supporting leads of ICs, LSIs, discrete semiconductor or the like and basically compresses a pad section for mounting IC chips, an inner lead section for wire bonding and an outer lead section for soldering to a printed wiring board.

Selective conditions for basic properties of lead frame materials are strength, suitability for punching, suitability for etching and the like. Secondary properties required of the lead frame material include chemical properties, suitability for plating, suitability for bonding, and suitability for soldering and silver brazing.

The present inventors have been engaged for many years in the research and development of lead frames having excellent bondability, solder wettability, and chip adhesion and have conducted many experiments. As a result, they have found the following matters. (1) Pure Pd has high catalytic activity and, hence, inhibits the curing of a paste resin. (2) The heat treatment of pure Pd to form an oxide layer improves the resin adhesion but deteriorates the bondability. (3) Au and Ag have good bondability but are unsatisfactory in resin adhesion.

Accordingly, the present inventors have made further strides. In the studies, after flashing of Pd plating with Au or Ag, heat treatment was conducted in the air to form a Pd-Au thermal diffusion layer or a Pd-Ag thermal diffusion layer. As a result, the present inventors have found that, in the thermal diffusion layer, the Pd portion forms an oxide layer, contributing to an improvement in resin adhesion, while the Au or Ag portion undergoes no thermal oxidation, contributing to an improvement in bondability.

The present invention has been made based on these findings, and the findings have led to the completion of the present invention.

The present invention will be described in more detail.

One aspect of the present invention provides a lead frame for a semiconductor device, comprising: a lead frame material; a Pd plating or a Pd alloy plating provided on the lead frame material; and a layer as an uppermost layer formed of a Pd oxide and Au or a Pd oxide and Ag.

Another aspect of the present invention provides a process for producing a lead frame for a semiconductor device, comprising the steps of: plating a lead frame material with Pd; flashing the surface of the Pd plating with Au or Ag; and heat-treating the plated lead frame material in the air to provide a Pd-Au diffusion layer or a Pd-Ag diffusion layer, an oxide layer being formed in only the Pd portion in the surface of the diffusion layer.

Alternatively, according to one embodiment of the present invention, after nickel (Ni) plating on the lead frame, Pd plating is performed, the Pd plating is flashed with Au or Ag, followed by heat treatment to form an oxide layer. Further, a Pd-Au alloy or a Pd-Ag alloy may be used instead of the Au or Ag flashing on the Pd plating.

In the present invention, all the Ni, Pd, Au, Ag, Pd-Au, and Pd-Ag layers may be formed by any of electroplating, electrolessplating, and vapor deposition.

Regarding heat treatment conditions, the heat treatment is performed in the air or an oxidizing atmosphere at a low temperature for a long period of time (for example, 150° C.×2 hr) or at a high temperature for a short period of time (for example, 700° C.×2 sec). Heat treatment at a high temperature for a long period of time causes diffusion of the substrate metal resulting in deteriorated bondability.

According to the present invention, the thickness of the Au or Ag flashing is limited to 0.005 to 0.05 μm. This is because when the thickness is less than 0.005 μm, the number of pinholes is increased making it impossible for the flashing to function as a thermal diffusion barrier layer, while the upper limit of the thickness is 0.05 μm for reasons of economy.

In the present invention, when Ni plating is provided on the lead frame material, the thickness of the Ni plating is preferably in the range of from 0.05 to 10 μm. Further, in the present invention, various laminate plating structures may be adopted as primer plating for the Pd plating, and, for example, laminate plating using alloy plating rather than Ni, Cu, and Pd is possible.

EXAMPLE 1

The surface of a lead frame made of a copper alloy material was degreased and activated by a conventional method, and the whole surface of the lead frame was plated with Ni to form a 1 μm-thick Ni layer. A 0.1 μm-thick Pd plating and a 0.03 μm-thick Au flashing were provided thereon, and the plated lead frame was heat-treated in the air.

The heat treatment was conduced under four heat treatment conditions, (1) 150° C.×2 hr, (2) 200° C.×40 sec, (3) 330° C.×20 sec, (4) 500° C.×5 sec. Pallabright-SST and Temperesist EX, commercially available plating solutions manufactured by Japan Pure Chemical Co., Ltd., were used respectively for Pd plating and Au flashing.

An enlarged cross-sectional view of a part of the resultant lead frame is shown in FIG. 1. In FIG. 1, numeral 10 designates a lead frame material, numeral 12 a Ni plating, numeral 13 a Pd plating, numeral 14 a Pd-Au diffusion layer, and numeral 15 a palladium-Au intermixture layer.

The lead frames thus obtained were evaluated for bondability, solder wettability, and Ag paste bond strength. Each evaluation was conducted by the following method.

Test for evaluation of bondability:

After heat treatment at 330° C. for 60 sec, wire bonding was conducted using a gold wire having a diameter of 25 μm under load 80 g and temperature 160° C. while applying ultrasonic energy under conditions of 800 mW (milliwatt) and 65 mS (millisecond), and the tensile strength was measured with a peel gage.

Test for evaluation of solder wettability:

The solder wettability was measured after heat treatment at 150° C. for 2 hr and at 300° C. for 2 min. Regarding soldering conditions, the lead frame was dip-coated with rosin-based nonactivation type R-100 flux manufactured by a Metal and immersed in 63% Sn-37% Pb solder bath of 230°±1° C., and the zero-cross time was measured.

Test for the evaluation of Ag paste bond strength:

After paste curing under conditions of temperature 160° C. and 60 min, the die shear strength was measured at 260° C.

The results of each evaluation test are tabulated in Table 1. In the evaluation, A is good, B somewhat good, C somewhat poor, and D poor.

EXAMPLE 2

The surface of a lead frame made of a copper alloy material was degreased and activated by a conventional method, and the whole surface of the lead frame was plated with Ni to form a 1 μm-thick Ni layer. A 0.1 μm-thick Pd plating and a 0.03 μm-thick Ag flashing were provided thereon, and the plated lead frame was heat-treated in the air.

The heat treatment was conduced under the same four heat treatment conditions as used in Example 1. Pallabright SST and Temperesist AGR, commercially available plating solutions manufactured by Japan Pure Chemical Co., Ltd., were used respectively for Pd plating and Ag flashing.

The lead frames thus obtained were evaluated for bondability, solder wettability, and Ag paste bond strength. The results of each evaluation test are tabulated in Table 1.

EXAMPLE 3

The surface of a lead frame made of a copper alloy material was degreased and activated by a conventional method, and the whole surface of the lead frame was plated with Ni to form a 1 μm-thick Ni layer. Subsequently, a 0.1 μm-thick Pd-Au alloy plating was provided thereon, and the plated lead frame was heat-treated in the air.

The heat treatment was conduced under the same four heat treatment conditions as used in Example 1. Pallabright WGP, a commercially available plating solution manufactured by Japan Pure Chemical Co., Ltd., was used for Pd-Au alloy plating.

The lead frames thus obtained were evaluated for bondability, solder wettability, and Ag paste bond strength. The results of each evaluation test are tabulated in Table 1.

EXAMPLE 4

The surface of a lead frame made of a copper alloy material was degreased and activated by a conventional method, and the whole surface of the lead frame was plated with Ni to form a 1 μm-thick Ni layer. Subsequently, a 0.1 μm-thick Pd-Au alloy plating was provided thereon, and the plated lead frame was heat-treated in the air.

The heat treatment was conduced under the same four heat treatment conditions as used in Example 1. Pallabright WAP, a commercially available plating solution manufactured by Japan Pure Chemical Co., Ltd., was used for Pd-Ag alloy plating.

The lead frames thus obtained were evaluated for bondability, solder wettability, and Ag paste bond strength. The results of each evaluation test are tabulated in Table 1.

TABLE 1

| Example | Sample No. | Surface layer | Heat treatment conditions | Evaluation test on bondability | | Evaluation test on solder wettability | | Evaluation test on paste bond strength | |
|---|---|---|---|---|---|---|---|---|---|
| | | | | Peel strength in wire bonding (g) | Evaluation | Zero-cross time (sec) | Evaluation | Die shear strength (kg) | Evaluation |
| Ex. 1 | 1 | Au | 150° C. × 2 hr | 9.5 | A | 0.3 | A | 2.91 | A |
| | 2 | Flash- | 200° C. × 40 sec | 9.3 | A | 0.3 | A | 3.02 | A |
| | 3 | ing on | 330° C. × 20 sec | 9.2 | A | 0.3 | A | 3.05 | A |
| | 4 | Pd | 500° C. × 5 sec | 9.5 | A | 0.3 | A | 2.95 | A |
| Ex. 2 | 5 | Ag | 150° C. × 2 hr | 10.8 | A | 0.2 | A | 2.80 | A |
| | 6 | flash- | 200° C. × 40 sec | 10.4 | A | 0.2 | A | 2.92 | A |
| | 7 | ing on | 330° C. × 20 sec | 10.4 | A | 0.2 | A | 2.90 | A |
| | 8 | Pd | 500° C. × 5 sec | 10.7 | A | 0.2 | A | 2.83 | A |
| Ex. 3 | 9 | Pd-Au | 150° C. × 2 hr | 9.3 | A | 0.3 | A | 3.03 | A |
| | 10 | alloy | 200° C. × 40 sec | 9.2 | A | 0.3 | A | 3.29 | A |
| | 11 | plating | 330° C. × 20 sec | 9.0 | A | 0.3 | A | 3.34 | A |
| | 12 | | 500° C. × 5 sec | 9.3 | A | 0.3 | A | 3.00 | A |
| Ex. 4 | 13 | Pd-Ag | 150° C. × 2 hr | 10.6 | A | 0.2 | A | 2.99 | A |
| | 14 | alloy | 200° C. × 40 sec | 10.3 | A | 0.2 | A | 3.18 | A |
| | 15 | plating | 330° C. × 20 sec | 10.1 | A | 0.2 | A | 3.39 | A |
| | 16 | | 500° C. × 5 sec | 10.5 | A | 0.2 | A | 3.11 | A |

COMPARATIVE EXAMPLES 1 TO 4

The surface of a lead frame made of a copper alloy material was degreased and activated by a conventional method, and the whole surface of the lead frame was plated with Ni to form a 1 μm-thick Ni layer. Subsequently, plating was conducted in the same manner as in Examples 1 to 4, thereby preparing lead frames which had not been heat-treated.

The lead frames thus obtained were evaluated for bondability, solder wettability, and Ag paste bond strength. The results of each evaluation test are tabulated in Table 2.

with Ni to form a 1 μm-thick Ni layer. Subsequently, a 0.1 μm-thick pure Pd plating was provided thereon to prepare a lead frame.

Pallabright SST, a commercially available plating solution manufactured by Japan Pure Chemical Co., Ltd., was used for the pure Pd plating.

The lead frame thus obtained was evaluated for bondability, solder wettability, and Ag paste bond strength. The results of each evaluation test are tabulated in Table 2.

TABLE 2

| Comparative Example | Sample No. | Surface layer | Heat treatment | Evaluation test on bondability | | Evaluation test on solder wettability | | Evaluation test on paste bond strength | |
|---|---|---|---|---|---|---|---|---|---|
| | | | | Peel strength in wire bonding (g) | Evaluation | Zero-cross time (sec) | Evaluation | Die shear strength (kg) | Evaluation |
| Comp. Ex. 1 | 17 | Au flash-ing on Pd | Not done | 9.6 | A | 0.3 | A | 1.12 | D |
| Comp. Ex. 2 | 18 | Ag flash-ing on Pd | Not done | 10.9 | A | 0.2 | A | 1.05 | D |
| Comp. Ex. 3 | 19 | Pd-Au alloy | Not done | 9.5 | A | 0.3 | A | 1.19 | D |
| Comp. Ex. 4 | 20 | Pd-Ag alloy | Not done | 10.7 | A | 0.2 | A | 1.18 | D |
| Comp. Ex. 5 | 21 | Pd | Not done | 7.4 | B | 2.5 | C | 1.81 | C |

COMPARATIVE EXAMPLE 5

The surface of a lead frame made of a copper alloy material was degreased and activated by a conventional method, and the whole surface of the lead frame was plated

EXAMPLE 6

Figure 2:
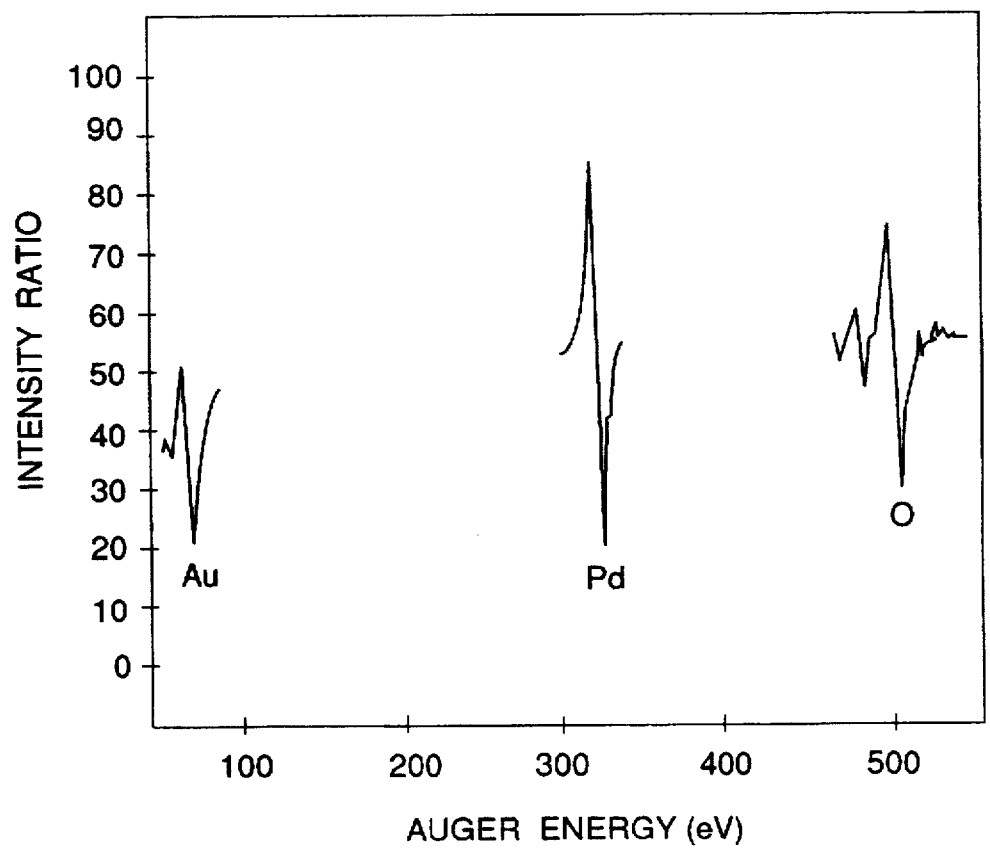
FIG. 2 is a graph showing the results of Auger electron spectroscopy for the outermost layer of a product which has been heat-treated at 330° C. for 20 sec in Example 1.
Figure 3:
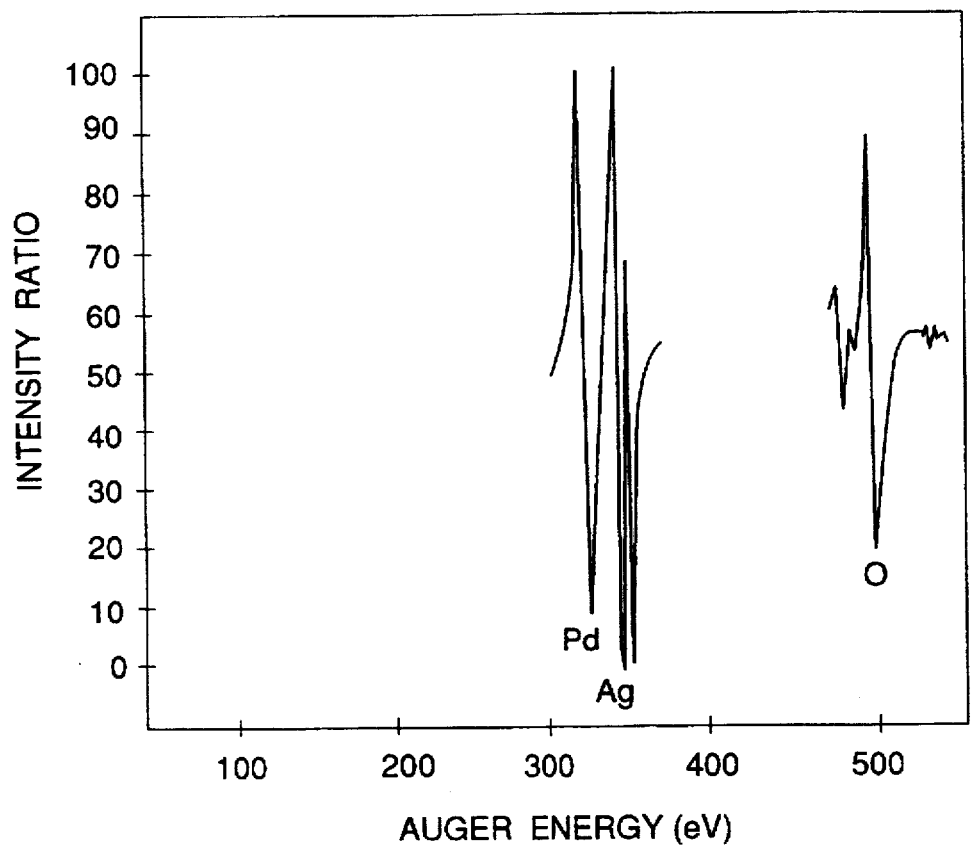
FIG. 3 is a graph showing the results of Auger electron spectroscopy for the outermost layer of a product which has been heat-treated at 330° C. for 20 sec in Example 2.

The outermost surface layer of sample No. 3 in Example 1 and sample No. 7 in Example 2, that is, samples wherein the surface of the Ni plating on the lead frame had been plated with Pd and flashed with Au (sample No. 3) or flashed with Ag (sample No. 7) followed by heat treatment at 330° C. for 20 sec, were analyzed by Auger electron spectroscopy. The analytical results are shown in FIGS. 2 and 3. Further, the results tabulated in Tables 3 and 4 were obtained from the data shown in FIGS. 2 and 3.

These results have revealed the presence of a Pd oxide layer in Au on the outermost surface of the lead frame and the presence of a Pd oxide layer in Ag on the outermost surface of the lead frame.

EXAMPLE 7

Sample No. 3 in Example 1 and sample No. 17 in Comparative Example 1, that is, samples wherein the surface of the Ni plating on the lead frame had been plated with Pd and flashed with Au followed by heat treatment at 330° C. for 20 sec (sample No. 3) or followed by no heat treatment (sample 17), were subjected to elementary analysis in the direction of the depth according to SIMS. The analytical results are shown in FIGS. 4 and 5.

Figure 4:
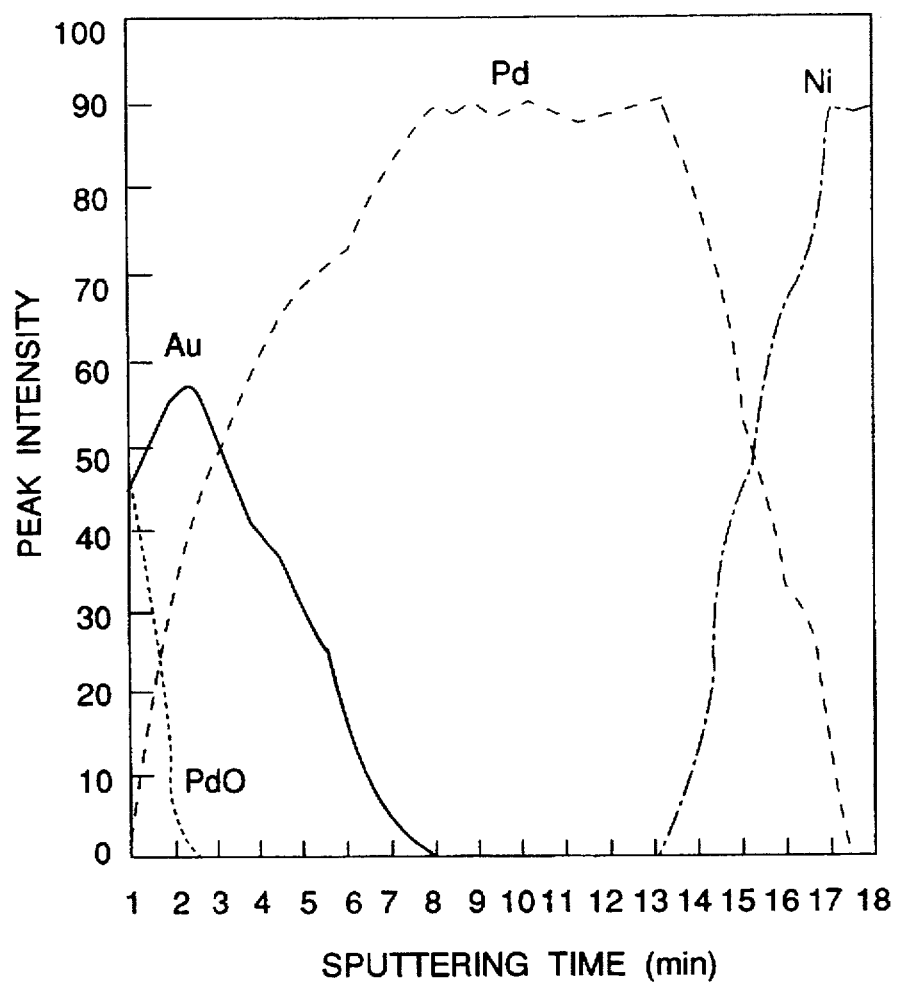
FIG. 4 is a graph showing the results of an elementary analysis in the direction of depth according to SIMS for a product which has been heat-treated at 330° C. for 20 sec in Example 1.
Figure 5:
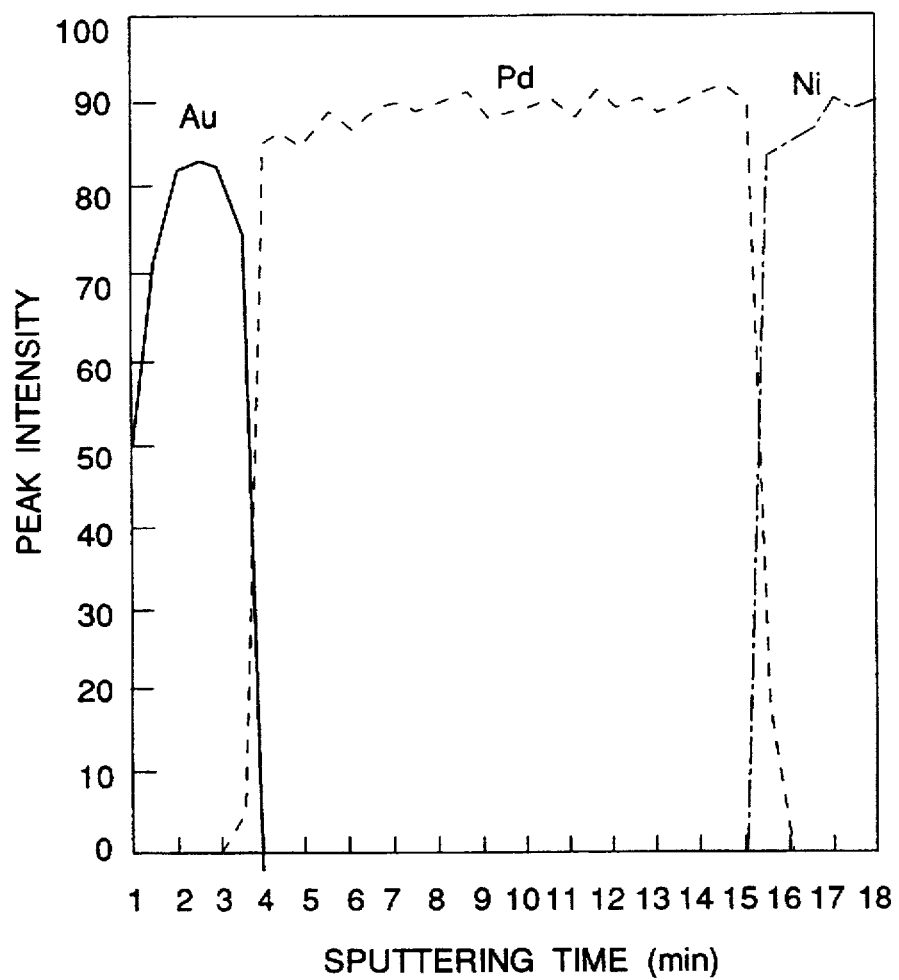
FIG. 5 is a graph showing the results of an elementary analysis in the direction of depth according to SIMS for a product prepared in Comparative Example 1.

From FIG. 4 (example of the present invention), the following matters were found.

(1) Au, Pd, and PdO are present in the outermost surface layer with Ni being absent.

(2) According to the elementary analysis in the direction of depth by etching, PdO in the outermost layer disappears by etching with the elapse of the sputtering time, indicating that PdO is in a very thin film form.

(3) The peak intensity for Pd increases with a reduction in the peak intensity for PdO and becomes maximum when the peak derived from Au disappears.

(4) The peak derived from Au does not overlap with that derived from Ni, demonstrating that Pd serves as a barrier layer to prevent Ni from being diffused into the surface.

From FIG. 5 (comparative example), the following matters were found.

(1) Au alone is present in the outermost layer with Pd, PdO, and Ni being absent.

(2) The elementary analysis in the direction of depth also reveals the absence of PdO.

From these results, for the lead frames according to the present invention, PdO is present in the outermost surface and contributes to an improvement in adhesion of the resin. Further, it is apparent that Au on the outermost surface contributes to an improvement in bondability and solder wettability.

TABLE 3

| Element | Energy (eV) | Quantitative determination (%) |
|---------|-------------|-------------------------------|
| Au      | 69.0        | 30.03                         |
| Pd      | 330.0       | 35.25                         |
| O       | 512.0       | 34.72                         |

TABLE 4

| Element | Energy (eV) | Quantitative determination (%) |
|---------|-------------|-------------------------------|
| Pd      | 330.0       | 28.85                         |
| Ag      | 351.0       | 34.93                         |
| O       | 512.0       | 36.22                         |

What is claimed is:

1. A lead frame for a semiconductor device, comprising: a lead frame material; a nickel or a nickel alloy plating as a first intermediate layer formed on said lead frame; a palladium or a palladium alloy plating as a second intermediate layer provided on the first intermediate layer; and an uppermost layer formed of a palladium oxide and gold formed on said second intermediate layer, and wherein the thickness of the uppermost layer formed of palladium oxide and gold is 0.005 to 0.05 μm.

2. A lead frame for a semiconductor device, comprising: a lead frame material; a nickel or a nickel alloy plating as a first intermediate layer on said lead frame material; a palladium or a palladium alloy plating as a second intermediate layer provided on said first intermediate layer; and an uppermost layer formed of a palladium oxide and silver formed on said second intermediate layer, and wherein the thickness of the uppermost layer formed of palladium oxide and silver is 0.005 to 0.05 μm.

* * * * *